United States Patent
Golden et al.

(10) Patent No.: US 12,276,551 B2
(45) Date of Patent: Apr. 15, 2025

(54) WIRELESS TEMPERATURE MONITORING BUFFERING SENSOR AND SYSTEM

(71) Applicant: Thermco Products, Inc., Lafayette, NJ (US)

(72) Inventors: Richard M. Golden, Denville, NJ (US); Eric J. Kownacki, Rancho Bernardo, CA (US); Leung Cham Ching, Hong Kong (CN)

(73) Assignee: Thermco Products, Inc., Lafayette, NJ (US)

( * ) Notice: Subject to any disclaimer, the term of this patent is extended or adjusted under 35 U.S.C. 154(b) by 613 days.

(21) Appl. No.: 17/582,960

(22) Filed: Jan. 24, 2022

(65) Prior Publication Data

US 2023/0236068 A1   Jul. 27, 2023

(51) Int. Cl.
  *G01K 1/024*   (2021.01)
  *G01K 7/22*   (2006.01)
  *G01R 31/371*   (2019.01)
  *H04B 7/26*   (2006.01)

(52) U.S. Cl.
  CPC ............... *G01K 1/024* (2013.01); *G01K 7/22* (2013.01); *H04B 7/26* (2013.01); *G01R 31/371* (2019.01)

(58) Field of Classification Search
  CPC . G01K 1/024; G01K 7/22; G01K 1/08; H04B 7/26; G01R 31/371
  See application file for complete search history.

(56) References Cited

U.S. PATENT DOCUMENTS

| | | |
|---|---|---|
| 6,045,258 A | 4/2000 | Sorgen |
| 7,150,156 B2 | 12/2006 | Gatling et al. |
| 9,046,292 B2 | 6/2015 | Burke et al. |
| 10,883,759 B2 | 1/2021 | Beham et al. |
| 10,887,735 B2 | 1/2021 | Castonzo |

(Continued)

FOREIGN PATENT DOCUMENTS

| | | |
|---|---|---|
| CN | 20566495 U | 10/2016 |
| CN | 107305145 | 10/2017 |

(Continued)

OTHER PUBLICATIONS

CAS Dataloggers, 5 Pages, http://www.dataloggerinc.com.

*Primary Examiner* — Steven Lim
*Assistant Examiner* — Mancil LittleJohn, Jr.
(74) *Attorney, Agent, or Firm* — Larry K. Roberts

(57) ABSTRACT

An exemplary embodiment is a temperature monitoring buffering sensor and system for applications ranging from food storage to temperature-controlled pharmaceuticals. The system includes a temperature sensor unit with a buffered temperature probe sensor contained in a housing with a Bluetooth® transmitter circuit. The sensor unit is battery operated and is self-contained without the need for wiring to provide power or signal flow. The sensor unit controller periodically sends out a transmitter beacon signal identifying the temperature sensor unit and the temperature sensed by the probe, as well as a battery condition. A base station is positioned close enough to be in range of the transmitter beacon signal and includes an RF receiver circuit configured to receive the RF transmitter beacon signal from the sensor unit, and a processor configured to monitor and analyze data received by the RF receiver circuit.

18 Claims, 6 Drawing Sheets

(56) References Cited

U.S. PATENT DOCUMENTS

| | | | |
|---|---|---|---|
| 10,989,646 B1 | 4/2021 | Dalmolin | |
| 2001/0035022 A1* | 11/2001 | Horey | F25C 1/12 |
| | | | 62/340 |
| 2018/0220207 A1* | 8/2018 | Michel | G08B 25/10 |
| 2018/0295187 A1 | 10/2018 | Sabata et al. | |
| 2019/0346200 A1 | 11/2019 | McMahon | |
| 2019/0364398 A1* | 11/2019 | Castonzo | H04W 4/029 |
| 2020/0396523 A1 | 12/2020 | Wolf et al. | |
| 2021/0161766 A1 | 6/2021 | Okuda et al. | |

FOREIGN PATENT DOCUMENTS

| | | | |
|---|---|---|---|
| CN | 109916528 A | | 6/2019 |
| DE | 102015202792 A1 | * | 8/2016 |
| KR | 20030025003 A | * | 3/2003 |

* cited by examiner

WIRELESS TEMPERATURE MONITORING BUFFERING SENSOR AND SYSTEM

CROSS-REFERENCE TO RELATED APPLICATION

This application is related to U.S. patent application Ser. No. 29/824,178 filed Jan. 21, 2022, the entire contents of which are hereby incorporated herein by this reference.

BACKGROUND

Monitoring temperatures in various environments has become of increasing importance, particularly those involving perishable goods. For example, monitoring temperatures of medications during transport and storage is often required, as the efficacy of the medications may typically be impaired if not stored at controlled temperatures.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION

Figure 1:
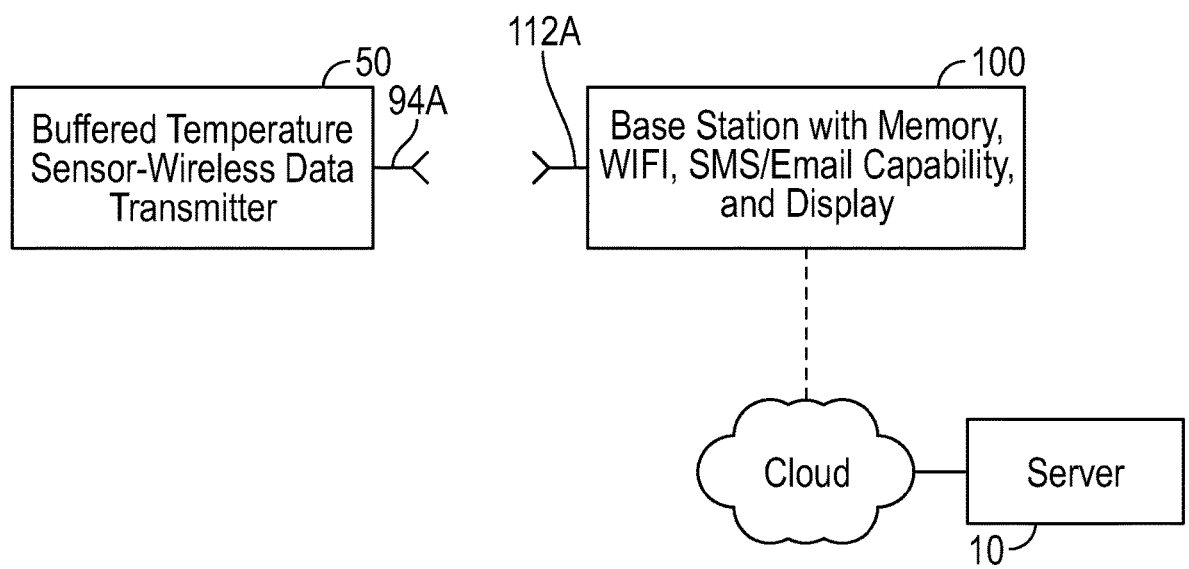
FIG. 1 is a simplified schematic illustration of an exemplary embodiment of a wireless temperature monitoring system.

In the following detailed description and in the several figures of the drawing, like elements are identified with like reference numerals. The figures may not be to scale, and relative feature sizes may be exaggerated for illustrative purposes.

An exemplary embodiment of the invention is a temperature monitoring buffering sensor and system for applications ranging from food storage to temperature-controlled pharmaceuticals. An example application for medications is a vaccine in refrigerated storage. With the COVID pandemic, monitoring vaccines in cold storage or in transit is critical to ensuring that the vaccines are maintained at the temperature requirements issued by entities such as the CDC.

As illustrated in FIG. 1, there are two parts to an exemplary embodiment of the system. The first unit is a temperature sensor unit 50 with a buffered temperature probe sensor contained in a housing with a Bluetooth transmitter circuit. The temperature probe is positioned inside a housing filled with a buffer mass, such as glycol. The sensor unit is battery operated and is self-contained without the need for wiring to provide power or signal flow. The sensor unit 50 is configured for positioning in an enclosed chamber, for example, holding the medications. Due to the probe being immersed in the buffer liquid, it is shielded from sudden changes in temperature, perhaps due to a refrigerator door in which the probe is positioned being opened, for example. The probe provides an electrical signal indicative of the sensed temperature. The transmitter module reads the signal, and periodically sends out a transmitter beacon signal. The beacon signal identifies the temperature sensor unit (e.g. by a unit serial number or data uniquely identifying the sensor unit) and the temperature sensed by the probe, as well as the battery condition (e.g. percentage of remaining battery life) and signal strength (e.g. RSSI). The beacon signal is transmitted every 10 seconds, although frequency and duration can be increased. The beacon signal in an exemplary embodiment is a 32-bit binary format, identifying the unit serial number, the sensed temperature, the battery condition and signal strength.

Still referring to FIG. 1, the second unit is a base station or gateway 100, positioned outside the refrigerated space but close enough to be in range of the beacon signal. The base station in one embodiment includes a display for displaying information, an RF transceiver circuit, a processor unit and memory, which receives data, analyzes it and generates a report of logged temperature readings over time. The base station may be configured to connect to the Internet and to upload the temperature readings and analytics to a server 10 for storage and further analysis. The base station may also detect out-of-range temperatures being monitored by the sensor unit 50, and may generate warning or status messages to a user, or to a cloud-based server, for example.

Figure 2:
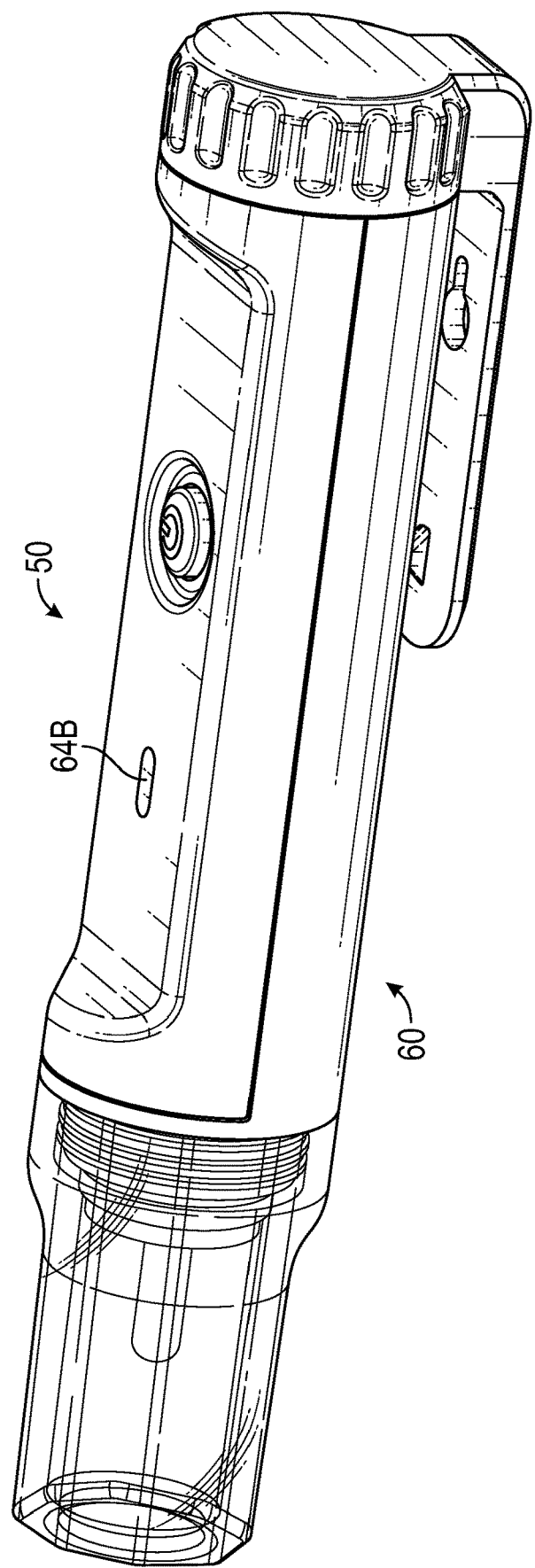
FIG. 2 is an isometric view of an exemplary embodiment of a temperature sensor unit.
Figure 3:
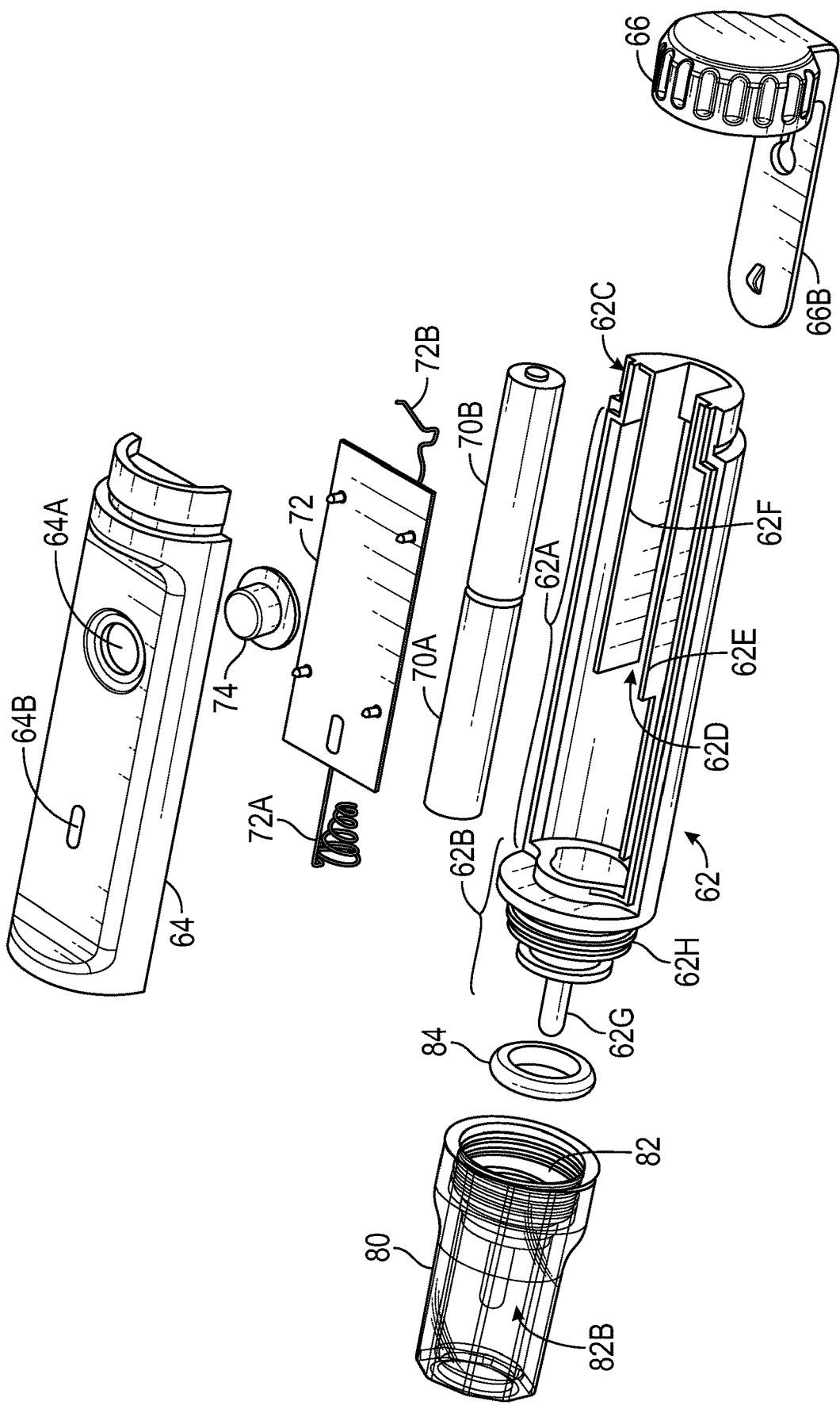
FIG. 3 is an exploded view of the embodiment of the sensor unit illustrated in FIG. 3.
Figure 4:
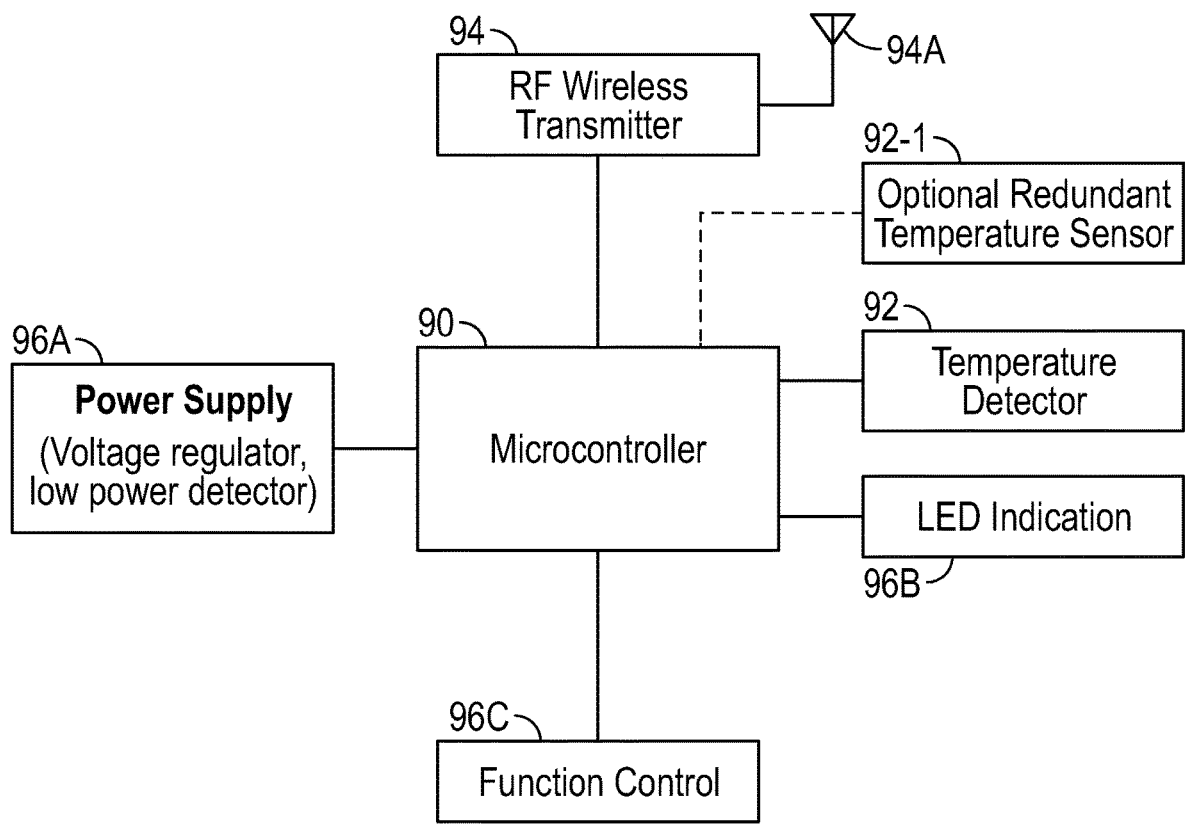
FIG. 4 is a simplified schematic diagram of an exemplary embodiment of the sensor unit.

An exemplary embodiment of the temperature sensor unit 50 is illustrated in FIGS. 2-4. The unit 50 includes a multi-piece housing 60 comprising housing structure 62 having an intermediate portion 62A having an outer generally half-cylindrically shaped configuration, a probe end portion 62B and a cap end portion 62C. The intermediate portion 62A is configured to hold AA batteries 70A, 70B in channel 62D formed by internal walls 62E, 62F. A circuit board and circuitry 72 is fitted onto the top surface of the walls. The circuitry 72 includes a metal coil 72A and metal conductor 72B to serve as battery electrical contacts.

The housing 60 further includes a cover structure 64 configured to fit onto the intermediate portion 62A of the structure 62 to enclose the batteries and circuit board with circuitry 72. The cover structure 64 may be secured to the intermediate portion 62A by adhesive, ultrasonic welding or other securing techniques. An elastomeric button 74 extends through opening 64A in the cover structure, and is configured to allow the user to turn the unit on and off by pressing the button, which transmits the pressing force onto a switch mounted to the circuit board under the button 74.

The probe end 62B of the structure 62A includes a probe enclosing tip portion 62G, and a threaded portion 62H. Buffer bottle 80 includes internal threads 82 configured to engage the threaded portion 62H to secure the buffer housing to the housing structure 62 after the internal chamber 82B has been filled with a buffer such as glycol. A gasket 84 is interposed between the buffer housing and the probe end 62B to prevent leakage of the buffer. In an exemplary embodiment, the volume of the buffer bottle is selected to be similar to the volume of a container of a medication vial whose temperature is being monitored.

The cap 66 serves as a battery cover, and cap portion 66A is configured to fit onto the cap end portion of the assembly of structures 62 and 64. The cap 66 is engaged onto the cap end portion of the assembly with a one quarter turn, and an electrical conductor (not shown) makes contact with a battery 70B electrode and provides electrical continuity with contact 72B. Removal of the cap 66 allows the batteries to be replaced if necessary. A clip portion 66B extends from the cap portion and provides a means to attach the sensor unit 50 to another structure.

FIG. 4 depicts a simplified schematic of the circuitry of an exemplary embodiment of the sensor unit 50. A microcontroller 90 is powered by power supply 96A which includes a voltage regulator circuit for regulating the voltage of the batteries 70A, 70B, and a low power (voltage) detector circuit. The microcontroller 90 is electrically connected to the temperature detector 92 enclosed within the probe tip 62G. In an exemplary embodiment, the detector 94 is a thermistor, although other temperature sensor types may also be used. The microcontroller 90 is electrically connected to a wireless transmitter circuit 94 with an antenna 94A. In an exemplary embodiment, the circuit 94 is a 2.4 Ghz transceiver module, and is configured for Bluetooth® data transmission. The sensor unit 50 in an exemplary embodiment is configured for one-way transmission, and does not receive signals from the base station 100.

Optionally, a redundant temperature sensor 92-1 (FIG. 4) may be positioned within the probe tip 62G, and monitored by the microcontroller 90. The microcontroller in this alternate embodiment may monitor the temperature sensors 92 and 92-1 and compare their readings over time, utilize one sensor instead of the other in the event the controller determines that one sensor is failing, or average the two sensor readings to arrive at the temperature transmitted by the sensor unit.

The sensor unit 50 further includes a function control 96C, which in one exemplary embodiment is a switch contacted and actuated by button 74. An LED 96B controlled by the microcontroller 90 provides a visual indication of the status of the sensor unit.

In an exemplary embodiment, the multi-piece housing structure and the bottle in an assembled configuration have a form factor of an overall length of less than 150 mm, a width of less than 32 mm and a height of less than 38 mm. In a particular embodiment, the assembled unit 50 has an overall length of 145 mm, the buffer bottle at its distal end from the housing 62 has a diameter of 20 mm, and the cap portion 66 has a diameter of 30 mm exclusive of the clip portion 66B. The form factor provides the advantage of requiring less space, for example in a refrigerator to monitor the temperature of medicinal products when undergoing storage or transport.

Figure 5:
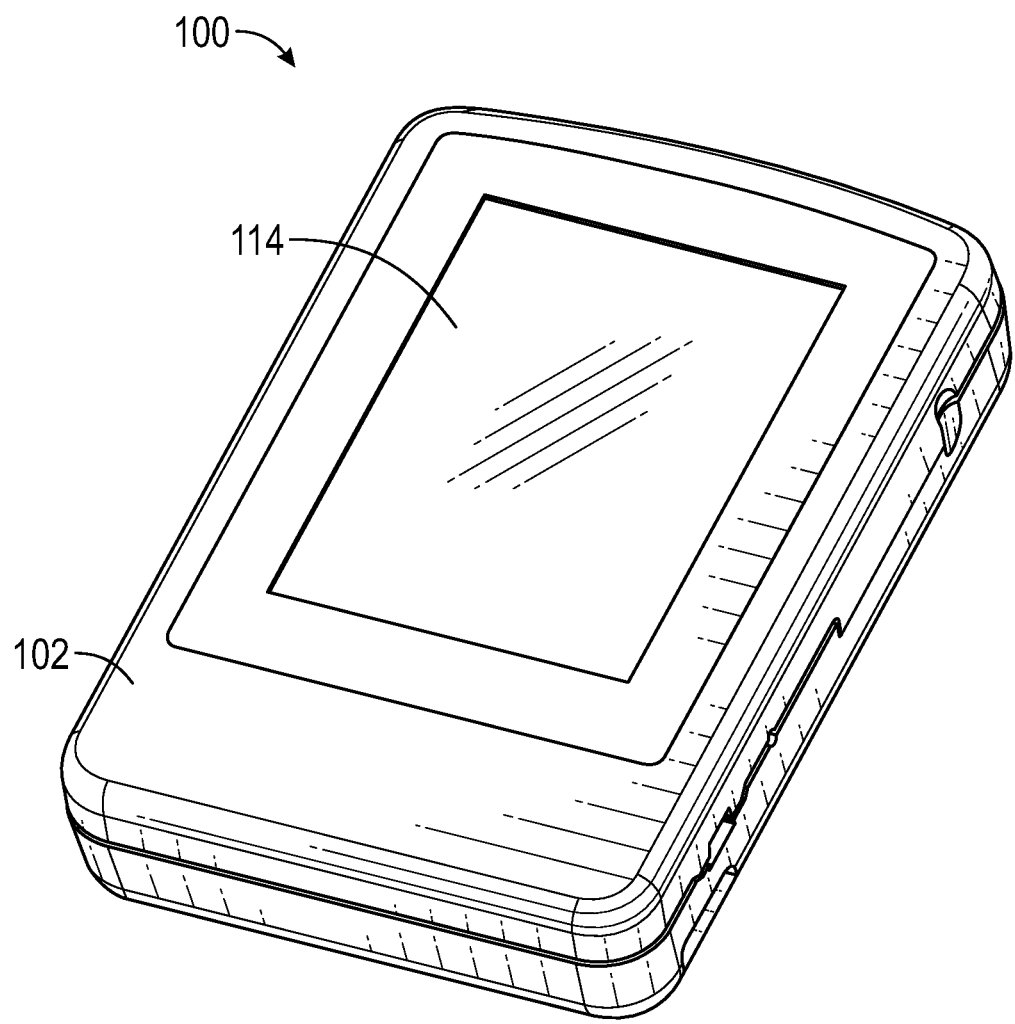
FIG. 5 is an isometric view of an exemplary embodiment of a base station as in FIG. 1.
Figure 6:
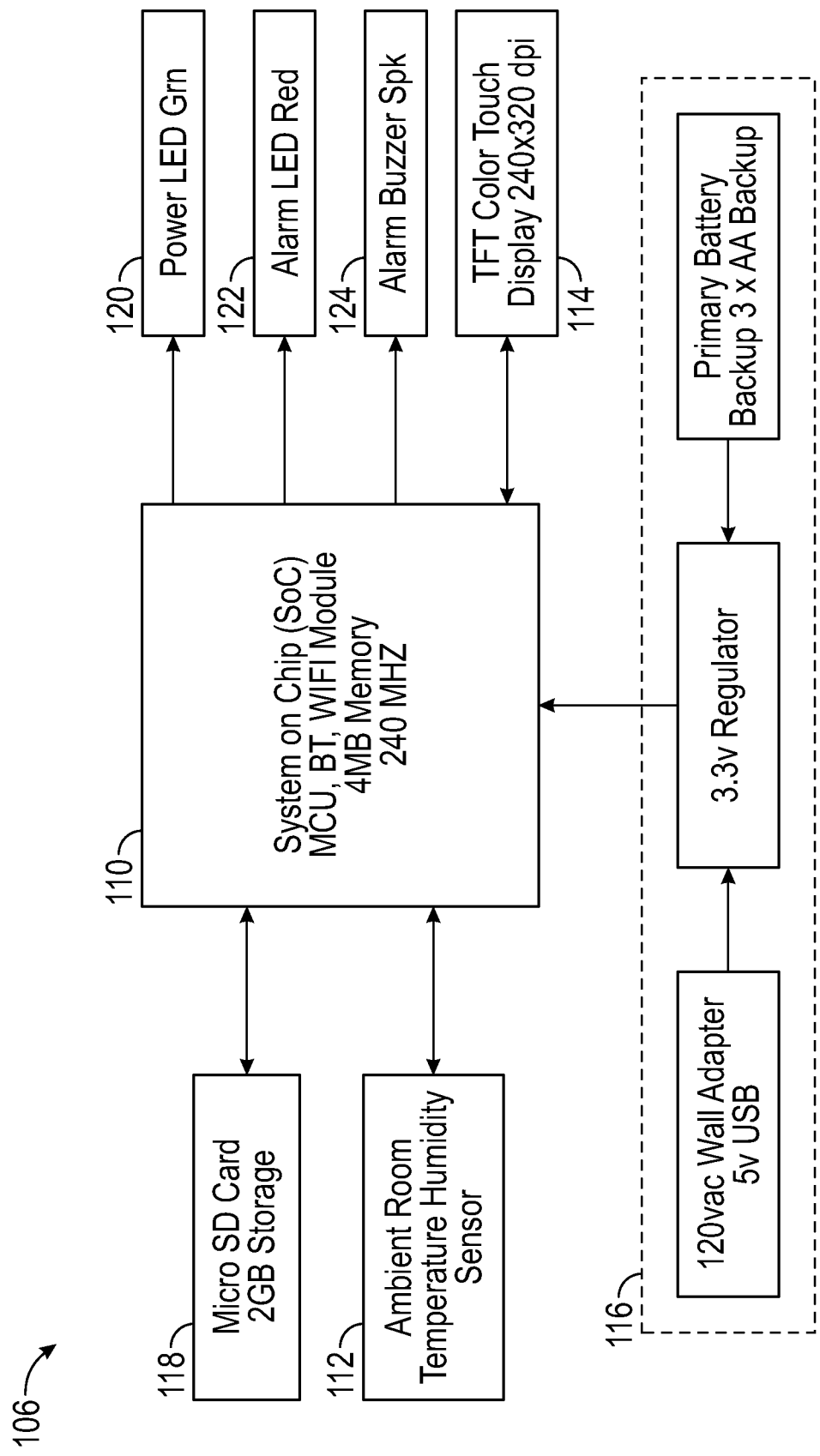
FIG. 6 is a simplified schematic diagram of an exemplary embodiment of the base station of FIG. 5.

FIGS. 5 and 6 illustrate an exemplary embodiment of the base station 100. In this embodiment, the base station is housed in a compact housing 102, which provides a relatively large LCD display 114. The display may display status information, such as the temperature being monitored by the sensor unit 50, as well as the current battery status of the sensor unit. The base station may also be configured to provide visual and audible signals indicative of an error condition, such as the temperature sensed by the sensor unit 50 being out of a predetermined range.

FIG. 6 is a simplified schematic of an exemplary embodiment of the electronic system 106 of the base station, which includes a system-on-a-chip (SoC) 110 configured to receive the transmissions from the sensor unit 50. The SoC 110 includes a microcontroller unit (MCU), Bluetooth®, SMS and WiFI modules and an onboard memory. The SoC 110 modules include the antennas, e.g. wiring traces on a printed circuit board, for reception of the sensor signals and for WIFI communication. In an exemplary embodiment, the sensor unit 50 is a transmit-only unit, and the base station 100 is not configured to transmit signals such as control signals to the sensor unit. The SoC 110 is configured to provide display signals to the touch display 114 to result in the data (temperature, sensor unit signal strength and battery status, sensor unit serial number, and messages indicating out-of-range temperatures, etc.) being displayed. The system 106 is programmed to determine from the received sensor signals error or out-of-range conditions, such as the sensed temperature being out of a predetermined nominal range, and determine that the sensor battery condition is low enough that the user should replace the batteries in the sensor or replace the sensor.

The system in this exemplary embodiment includes an ambient room temperature and humidity sensor 112.

The base station 100 is powered by power supply 116, which may be AA batteries, a low voltage supply connected to line voltage, or both, as indicated in FIG. 6, in which a battery backs up a line voltage adapter and voltage regulator. The system further includes a nonvolatile memory 118, which is configured to store data, including historical temperature and status data from the sensor unit 50.

The base station may be configured for communication with a remote server 10 (FIG. 1), e.g. via the controller SoC 110. SMS and/or email connectivity to the user may be provided by the SoC 110.

The controller 110 preferably includes an algorithm to monitor and indicate out-of-range temperatures being sensed by the sensor unit 50. The controller 110 includes an algorithm to monitor the sensor battery condition data from the sensor beacon signal and issue a warning that the batteries or the sensor need replacing. An alarm red LED 122 and an alarm buzzer speaker 124 are activated by an alarm condition such as out-of-range temperatures. A green LED 120 indicates power is supplied by the line voltage adapter.

In operation, the user turns on the base station 100. Pressing the power button 74 initiates operation of the sensor unit 50, causing the LED indicator 96 to flash five times to indicate the unit is now in operation. In an exemplary embodiment, the sensor unit sends out a beacon signal periodically, e.g. every 10 seconds. The low power indication is also indicated by the LED indicator 96B flashing continuously, e.g. at a 1 Hz flash rate. This indicates that it is time to replace the batteries in the unit, or to replace the unit with a new unit. To turn off the transmitter of unit 50, the power button 74 is pressed and held for three seconds; the LED indicator is also flashed three times to indicate the unit has been powered off.

In an exemplary embodiment of the system, the RF transmitter circuit of the temperature sensor unit 50 and the RF receiver circuit of the base station 100 are configured to utilize ultra-low power Bluetooth® protocols, at 2.4 GHz.

The sensor unit 50 requires no wires for communication or power, which prevents ice damming and provides protection against thermal shock to temperature, thermal stability in temperature (against temperature swings resulting from opening and closing refrigerator doors) or to be used in stationary cold chain applications.

Although the foregoing has been a description and illustration of specific embodiments of the subject matter, various modifications and changes thereto can be made by persons skilled in the art without departing from the scope and spirit of the invention.

What is claimed is:

1. A portable, self-contained temperature sensor unit, comprising:
   a multi-piece housing including:
   an elongated housing structure with an intermediate portion having an outer generally half-cylindrically shaped configuration, a probe end portion extending from a first end of the intermediate portion, and a cap end portion;

the probe end portion including a probe sensor enclosing tip portion and a buffer-bottle engaging portion;

a cover structure configured to be assembled onto the intermediate portion of the elongated housing structure; and a cap portion configured to fit onto the cap end portion and an end of the assembled cover structure;

the temperature sensor unit further comprising:

a temperature probe sensor disposed within a distal tip portion of the probe end portion, provides an electrical signal indicative of a sensed temperature;

an electronic module including an RF wireless transmitter circuit, an antenna connected to the RF wireless transmitter circuit; a processor, and a battery module for providing electrical power to the electronic module, the electronic module configured to read the electrical signal and to periodically transmit an RF wireless transmitter beacon signal identifying the temperature sensor unit and the temperature sensed by the probe sensor;

the electronic module fitted within the intermediate portion of the elongated housing structure and enclosed by the assembled cover structure;

a buffer bottle defining a buffer chamber and including an engagement portion configured to removably engage the buffer-bottle engaging portion of the intermediate portion to secure the buffer bottle to the housing structure; and a buffer disposed within the buffer chamber and surrounding the distal tip portion;

wherein the sensor unit is self-contained and requires no wires to an external power source or to deliver temperature readings, and further provides protection against thermal shock to temperature and thermal stability in temperature.

2. The sensor unit of claim 1, wherein the buffer is glycol, the buffer-bottle engaging portion includes a threaded portion, the engagement portion of the buffer bottle includes a threaded portion, and further including a gasket fitted between the buffer bottle and the threaded portion of the probe end portion.

3. The sensor unit of claim 1, wherein the beacon signal further includes battery module condition data and signal strength data.

4. The sensor unit of claim 1, wherein the multi-piece housing structure and the bottle in an assembled configuration has a form factor of an overall length of less than 150 mm, a width of less than 32 mm and a height of less than 38 mm.

5. The sensor unit of claim 1, wherein the temperature probe sensor includes a thermistor.

6. The sensor unit of claim 1, further comprising a second temperature probe sensor disposed within a distal tip portion of the probe end portion, provides a second electrical signal indicative of a temperature sensed by the second temperature probe sensor, the electronic module further configured to read the second electrical signal and compare the readings of each temperature sensor over time, and to utilize one sensor instead of the other in the event the electronic module determines that one sensor is failing.

7. A temperature sensing system for use in monitoring temperatures in a refrigerated space, comprising a combination including:

a temperature sensor unit as in claim 1;

a base station positioned outside the refrigerated space but close enough to be in range of the wireless transmitter beacon signal, the base station comprising:

a display for displaying status information regarding the temperature sensor including temperature information;

an RF receiver circuit configured to receive RF transmitter beacon signal from the sensor unit, a processor unit and memory, the processor configured to monitor and analyze data received by the RF receiver circuit, and to control the display to display the status information.

8. The system of claim 7, wherein the RF transmitter circuit of the temperature sensor unit and the RF receiver circuit of the base station are configured to utilize Bluetooth® communication protocols.

9. A temperature sensing system for use in monitoring temperatures in a refrigerated space, comprising:

a temperature sensor unit, comprising:

a multi-piece housing including:

an elongated housing structure with an intermediate portion, a probe end portion extending from a first end of the intermediate portion, and a cap end portion disposed at a second end of the intermediate portion;

a cover structure configured to be assembled onto the intermediate portion of the elongated housing structure;

a cap portion configured to fit onto the cap end portion and an end of the assembled cover structure;

a temperature sensor disposed within a distal tip portion of the probe end portion, the temperature sensor configured to provide an electrical signal indicative of a sensed temperature;

an electronic module including an RF wireless transmitter circuit, an antenna connected to the RF wireless transmitter circuit; a processor, and a battery module for providing electrical power to the electronic module, the electronic module configured to read the electrical signal and to periodically transmit an RF wireless transmitter beacon signal identifying the temperature sensor unit and the temperature sensed by the probe sensor;

the electronic module fitted within the intermediate portion of the elongated housing structure and enclosed by the assembled cover structure;

a buffer bottle defining a buffer chamber and configured to attach to the intermediate portion to secure the buffer bottle to the housing structure; and a buffer mass disposed within the buffer chamber and surrounding the distal tip portion;

wherein the multi-piece housing structure and the bottle in an assembled configuration has a form factor of an overall length of less than 150 mm, a width of less than 32 mm and a height of less than 38 mm; and a base station positioned outside the refrigerated space but close enough to be in range of the wireless transmitter beacon signal, the base station comprising an RF receiver circuit configured to receive RF transmitter beacon signal from the sensor unit, a processor unit and memory, the processor configured to monitor and analyze data received by the RF receiver circuit.

10. The system of claim 9, wherein the buffer is glycol, and further including a gasket fitted between the buffer bottle and the probe end portion.

11. The system of claim 9, wherein the sensor unit beacon signal further includes data representing a condition of the battery module, and the base station processor is further configured to monitor the beacon signal for low battery conditions and to issue a warning that the sensor or the sensor battery module should be replaced.

12. The system of claim 11, wherein the beacon signal identifies a sensor unit serial number, the sensed temperature, the battery condition and a transmitted signal strength.

13. The system of claim 9, wherein the RF transmitter circuit of the temperature sensor unit and the RF receiver circuit of the base station are configured to utilize Bluetooth® communication protocols.

14. A temperature sensing system for use in monitoring temperatures in a refrigerated space, comprising:
   a self-contained temperature sensor unit, comprising:
   a multi-piece housing including:
   an elongated housing structure with an intermediate portion, a probe end portion extending from a first end of the intermediate portion, and a cap end portion disposed at a second end of the intermediate portion;
   a cover structure configured to be assembled onto the intermediate portion of the elongated housing structure;
   a cap portion configured to fit onto the cap end portion and an end of the assembled cover structure;
   a temperature sensor disposed within a distal tip portion of the probe end portion, the temperature sensor configured to provide an electrical signal indicative of a sensed temperature;
   an electronic module including an RF wireless transmitter circuit, an antenna connected to the RF wireless transmitter circuit; a processor, and a battery module for providing electrical power to the electronic module, the electronic module configured to read the electrical signal and to periodically transmit an RF wireless transmitter beacon signal identifying the temperature sensor unit, the temperature sensed by the probe sensor and a battery module condition;
   the electronic module fitted within the intermediate portion of the elongated housing structure and enclosed by the assembled cover structure;
   a buffer bottle defining a buffer chamber and configured to attach to the intermediate portion to secure the buffer bottle to the housing structure; and
   a buffer mass disposed within the buffer chamber and surrounding the distal tip portion; and
   wherein the multi-piece housing structure and the bottle in an assembled configuration has a form factor of an overall length of less than 150 mm, a width of less than 32 mm and a height of less than 38 mm; and
   a base station positioned outside the refrigerated space but close enough to be in range of the wireless transmitter beacon signal, the base station comprising an RF receiver circuit configured to receive RF transmitter beacon signal from the sensor unit, a processor unit and memory, the processor configured to monitor and analyze data received by the RF receiver circuit, the processor configured to identify out-of-range sensor temperature conditions and to identify a low sensor battery condition, and to generate alerts indicative of said identified conditions.

15. The system of claim 14, wherein the buffer is glycol, and further including a gasket fitted between the buffer bottle and the probe end portion.

16. The system of claim 14, wherein the beacon signal identifies a sensor unit serial number, the sensed temperature, the battery condition and a transmitted signal strength.

17. The system of claim 14, wherein the RF transmitter circuit of the temperature sensor unit and the RF receiver circuit of the base station are configured to utilize Bluetooth® communication protocols.

18. The sensor unit of claim 1, further comprising a user-manipulable function switch accessible to the user on the housing and configured to allow the user to manually turn the sensor unit on or off.

* * * * *